United States Patent
Kiss et al.

(10) Patent No.: US 9,385,837 B2
(45) Date of Patent: Jul. 5, 2016

(54) CASCADED VITERBI BITSTREAM GENERATOR

(71) Applicant: LSI Corporation, San Jose, CA (US)

(72) Inventors: Peter Kiss, Basking Ridge, NJ (US);
Said E. Abdelli, Minneapolis, MN (US);
Donald R. Laturell, Oak Hill, FL (US);
James F. MacDonald, Mendota Heights, MN (US); Ross S. Wilson, Menlo Park, CA (US)

(73) Assignee: Avago Technologies General IP (Singapore) Pte. Ltd., Singapore (SG)

( * ) Notice: Subject to any disclaimer, the term of this patent is extended or adjusted under 35 U.S.C. 154(b) by 59 days.

(21) Appl. No.: 14/380,880

(22) PCT Filed: Jan. 18, 2013

(86) PCT No.: PCT/US2013/022321
§ 371 (c)(1),
(2) Date: Aug. 25, 2014

(87) PCT Pub. No.: WO2014/113028
PCT Pub. Date: Jul. 24, 2014

(65) Prior Publication Data
US 2015/0074501 A1    Mar. 12, 2015

(51) Int. Cl.
| | |
|---|---|
| *H03M 13/03* | (2006.01) |
| *H04L 1/00* | (2006.01) |
| *G06F 17/10* | (2006.01) |
| *H03M 13/23* | (2006.01) |
| *H03M 7/30* | (2006.01) |
| *H03M 13/41* | (2006.01) |

(52) U.S. Cl.
CPC .............. *H04L 1/0059* (2013.01); *G06F 17/10* (2013.01); *H03M 7/3022* (2013.01); *H03M 13/23* (2013.01); *H03M 13/41* (2013.01)

(58) Field of Classification Search
CPC .. H04L 1/0059; H03M 7/3022; H03M 13/23; H03M 13/41; G06F 17/10
See application file for complete search history.

(56) References Cited

U.S. PATENT DOCUMENTS

| | | | | |
|---|---|---|---|---|
| 5,153,593 | A * | 10/1992 | Walden | H03M 3/354 341/143 |
| 2002/0030618 | A1 | 3/2002 | Cusinato et al. | |
| 2002/0036578 | A1 | 3/2002 | Reefman | |
| 2002/0159604 | A1 | 10/2002 | Eastty et al. | |

OTHER PUBLICATIONS

Authors: Pieter Harpe, Derk Reefman, Erwin Janssen; Title: Efficient Trellis-type Sigma Delta Modulator; Date: Mar. 22-25, 2003; Publisher: Audio Engineering Society Convention Paper 5845, Presented at the 114th Convention, Amsterdam, The Netherlands.*
Harpe et al., "Efficient Trellis-type Sigma Delta Modulator," Proceeding of the 114th Convention Audio Engineering Society, Mar. 22-25, 2003, pp. 1-8.

* cited by examiner

*Primary Examiner* — Bryce Bonzo
*Assistant Examiner* — Thien D Nguyen (57) ABSTRACT

A bitstream generator includes at least first and second bitstream generator stages connected in a cascaded arrangement. The first bitstream generator stage includes a first adder which receives an input signal and generates a first error signal indicative of a difference between the input signal and a first bitstream candidate representing a closest approximation to the input signal among multiple bitstream candidates generated by the first bitstream generator stage. The second bitstream generator stage includes a second adder which receives the first error signal and generates a second error signal indicative of a difference between the first error signal and a second bitstream candidate representing a closest approximation to the input signal among multiple bitstream candidates generated by the second bitstream generator stage. A third adder in the bitstream generator receives the first and second bitstream candidates and generates an output signal more closely approximating the input signal.

20 Claims, 10 Drawing Sheets

CASCADED VITERBI BITSTREAM GENERATOR

CROSS-REFERENCE TO RELATED APPLICATION(S)

The present application is a national stage entry, under 35 U.S.C. §371, of PCT International Patent Application No. PCT/US2013/022321 filed on Jan. 18, 2013, the complete disclosure of which is expressly incorporated herein by reference in its entirety for all purposes.

BACKGROUND

Delta-sigma ($\Delta\Sigma$) modulation, sometimes referred to as sigma-delta ($\Sigma\Delta$) modulation, is a well-known technique for converting (i.e., encoding) analog signals into digital signals, or converting higher-resolution digital signals into lower-resolution digital signals. Delta-sigma modulators (or converters) essentially employ oversampling to reduce the in-band power of quantization noise, and use feedback to shape this noise and move it out-of-band. The intrinsic tolerance of delta-sigma converters to analog circuitry inaccuracy renders them very well-suited for the on-chip design of high-resolution interfaces in mixed-signal application-specific integrated circuits (ASICs).

Delta-sigma modulators of various types have been used for analog-to-digital and digital-to-analog conversion over the last several decades. Moreover, delta-sigma modulators have been used in high-efficiency switching power amplifiers (SWPAs), including, for example, class-D SWPAs, commonly used for digital audio applications, and class-S SWPAs, commonly used for radio-frequency (RF) applications.

It is well-known that higher-order (e.g., an order greater than two) one-bit, single-loop delta-sigma modulators suffer from instabilities. To address this shortcoming, cascaded delta-sigma modulators have been proposed which are constructed by cascading a chain of stable, lower-order (usually one-bit) modulators to build a stable higher-order modulator. The output of a cascaded modulator, fabricated from one-bit modulators, forms a multiple-bit bitstream.

More recently, delta-sigma modulators using Viterbi decoders as quantizers with memory were introduced for digital audio applications. (See, e.g., H. Kato, "Trellis Noise-shaping Converters and 1-bit Digital Audio," *Proceedings of the AES* 112th *Convention, Munich*, preprint 5615, May 10-13, 2002, and P. Harpe, "Trellis-type Sigma-delta Modulators for Super Audio CD Applications," *Research Report*, Philips Research, Jan. 29, 2003, the disclosures of which are incorporated herein by reference in their entireties for all purposes.) As regular (i.e., memory-less or non-Viterbi) higher-order one-bit, single-loop delta-sigma modulators are known to suffer from instabilities, higher-order one-bit, single-loop Viterbi bitstream generators are also more prone to instabilities than lower-order one-bit, single-loop Viterbi bitstream generators.

SUMMARY

Embodiments of the invention provide techniques for forming a stable higher-order (e.g., greater than two) bitstream generator using a plurality of cascaded lower-order bitstream generators.

In accordance with an embodiment of the invention, a bitstream generator includes at least first and second bitstream generator stages connected in a cascaded arrangement. The first bitstream generator stage includes a first adder adapted to receive an input signal supplied to the bitstream generator and operative to generate a first error signal indicative of a difference between the input signal and a first bitstream candidate that represents a closest approximation to the input signal among a plurality of bitstream candidates generated by the first bitstream generator stage. The second bitstream generator stage includes a second adder adapted to receive the first error signal generated by the first adder and operative to generate a second error signal indicative of a difference between the first error signal and a second bitstream candidate that represents a closest approximation to the input signal among a plurality of bitstream candidates generated by the second bitstream generator stage. The bitstream generator further includes a third adder adapted to receive the first and second bitstream candidates generated by the first and second bitstream generator stages, respectively, and operative to generate an output signal that more closely approximates the input signal compared to the first bitstream candidate.

In accordance with an embodiment of the invention, a method for forming a stable higher-order bitstream generator using a plurality of lower-order bitstream generators includes steps of: providing at least first and second bitstream generator stages; connecting the first and second bitstream generator stages in a cascaded arrangement, the first bitstream generator stage including a first adder adapted to receive an input signal supplied to the bitstream generator and operative to generate a first error signal indicative of a difference between the input signal and a first bitstream candidate that represents a closest approximation to the input signal among a plurality of bitstream candidates generated by the first bitstream generator stage, the second bitstream generator stage including a second adder adapted to receive the first error signal generated by the first adder and operative to generate a second error signal indicative of a difference between the first error signal and a second bitstream candidate that represents a closest approximation to the input signal among a plurality of bitstream candidates generated by the second bitstream generator stage; and adding the first and second bitstream candidates generated by the first and second bitstream generator stages, respectively, to thereby generate an output signal of the bitstream generator that more closely approximates the input signal compared to the first bitstream candidate.

Embodiments of the invention will become apparent from the following detailed description thereof, which is to be read in connection with the accompanying drawings.

BRIEF DESCRIPTION OF THE DRAWINGS

The following drawings are presented by way of example only and without limitation, wherein like reference numerals (when used) indicate corresponding elements throughout the several views, and wherein.

It is to be appreciated that elements in the figures are illustrated for simplicity and clarity. Common but well-understood elements that may be useful or necessary in a commercially feasible embodiment may not be shown in order to facilitate a less hindered view of the illustrated embodiments.

DETAILED DESCRIPTION

Embodiments of the invention will be described herein in the context of illustrative delta-sigma modulators and Viterbi bitstream generators. It should be understood, however, that embodiments of the invention are not limited to these or any other particular bitstream generators. Rather, embodiments of the invention are more broadly related to techniques for forming a stable Viterbi bitstream generator using a plurality of cascaded single-loop bitstream generators. In this regard, embodiments of the invention provide techniques for forming stable higher-order (e.g., greater than two) bitstream generators. Moreover, it will become apparent to those skilled in the art given the teachings herein that numerous modifications can be made to the illustrative embodiments shown that are within the scope of the claimed invention. That is, no limitations with respect to the embodiments shown and described herein are intended or should be inferred.

As a preliminary matter, for purposes of clarifying and describing embodiments of the invention, the following table provides a summary of certain acronyms and their corresponding definitions, as the terms are used herein:

Table of Acronym Definitions

| Acronym | Definition |
| --- | --- |
| ASIC | Application-specific integrated circuit |
| SWPA | Switching power amplifier |
| RF | Radio frequency |
| STF | Signal transfer function |
| NTF | Noise transfer function |
| MASH | Multi-stage noise shaping |
| WCDMA | Wideband code division multiple access |
| dBFS | Signal level in dB relative to digital full scale |

Figure 1A:
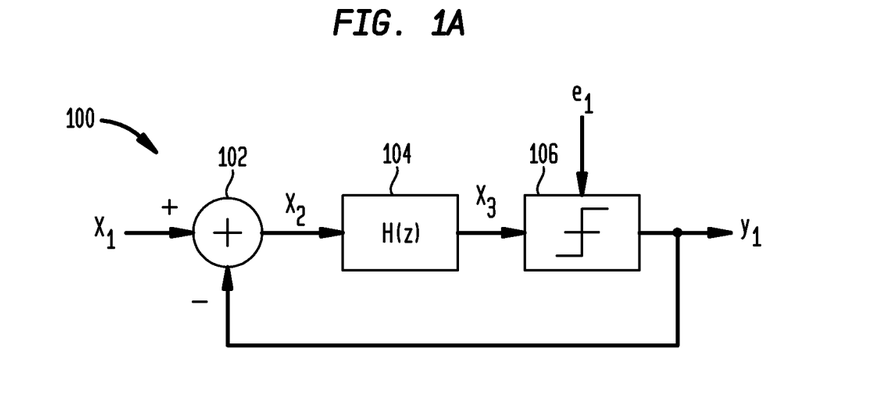
FIG. 1A is a block diagram depicting an exemplary single-loop delta-sigma bitstream generator.

FIG. 1A is a block diagram depicting an exemplary single-loop delta-sigma modulator 100. The delta-sigma modulator 100 includes an adder 102, a loop filter 104, or alternative filter circuit, and a bit-quantizer 106 (or alternative truncator, comparator, slicer, etc.). The adder 102 comprises a first input adapted to receive an input signal, $x_1$, and a second input adapted to receive a bitstream candidate, $y_1$. The adder 102 is operative to generate an output signal, $x_2$, which is equal to $x_1 - y_1$. The loop filter 104 is adapted to receive, as an input, the signal $x_2$ from the adder 102 and to generate, as an output, a signal $x_3$ which is supplied to a first input of the bit-quantizer 106. A second input of the bit-quantizer 106 is adapted to receive an error signal, $e_1$. The error signal $e_1$ is the truncation (or quantization) error of the bit-quantizer 106 and it is given by the difference between the output and input of the bit-quantizer. The bit-quantizer 106 is operative to generate the output $y_1$, which is indicative of a bitstream candidate that most closely approximates the sampled input signal as a function of the error signal $e_1$ and previous bitstream candidates.

Figure 1B:
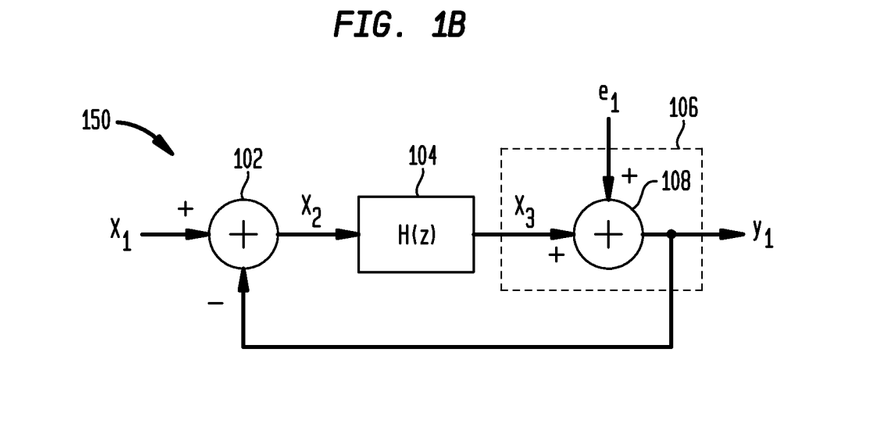
FIG. 1B is a block diagram depicting a linearized model of the illustrative bitstream generator shown in FIG. 1A.

FIG. 1B is a block diagram depicting an exemplary single-loop delta-sigma modulator 150. The delta-sigma modulator 150 is a linearized model of the illustrative delta-sigma modulator 100 shown in FIG. 1A. In this example, the bit-quantizer 106 is implemented using an adder 108 having a first input adapted to receive signal $x_3$ generated by loop filter 104, and a second input adapted to receive truncation error signal $e_1$. Thus, the bitstream candidate fed back to adder 102 will be a sum of the error signal $e_1$ and the signal $x_3$ (i.e., $y_1 = e_1 + x_3$) for a given sample period. Output signal $y_1$ generated by the adder 108, as in FIG. 1A, represents a bitstream candidate that closely approximates the sampled input signal $x_1$ in the frequency band of interest where $x_1$ has its energy concentrated.

The output signal $y_1$, represented in the z-domain as $Y_1$, can be determined as follows:

$$Y_1 = (X_1 - Y_1) \cdot H + E_1, \quad (1)$$

where H is the transfer function of the modulator's loop filter 104. Rearranging terms in equation (1) yields the following derivation:

$$Y_1 \cdot (1 + H) = X_1 \cdot H + E_1 \quad (2)$$
$$Y_1 = \frac{H}{1+H} \cdot X_1 + \frac{1}{1+H} \cdot E_1$$

In equation (2) above, a signal transfer function (STF) of the delta-sigma modulator 150 can be defined as $$STF = \frac{H}{1+H},$$

and a noise transfer function (NTF) of the delta-sigma modulator can be defined as $$NTF = \frac{1}{1+H}.$$

Using these definitions for STF and NTF, the output signal $Y_1$ can be expressed as follows:

$$Y_1 = STF \cdot X_1 + NTF \cdot E_1$$

Note, that the STF and NTF are based on a linearized model of the delta-sigma modulator 150, which is merely an approximation and does not accurately describe the non-linear modulator under all circumstances.

As previously stated, it is well known that higher-order (e.g., greater than two) one-bit, single-loop delta-sigma modulators suffer from instabilities. To address this shortcoming, cascaded delta-sigma modulators have been proposed which are constructed by cascading multiple stable, lower-order modulators (usually one-bit) to build a stable higher-order modulator (see, e.g., Steven R. Norsworthy, Richard Schreier, and Gabor C. Temes, "Delta-Sigma Data Converters: Theory, Design, and Simulation," IEEE Press, 1997, the disclosure of which is incorporated herein by reference). An output of a cascaded modulator, fabricated from one-bit modulators, forms a multiple-bit bitstream, as will be described in conjunction with FIG. 2.

Figure 2:
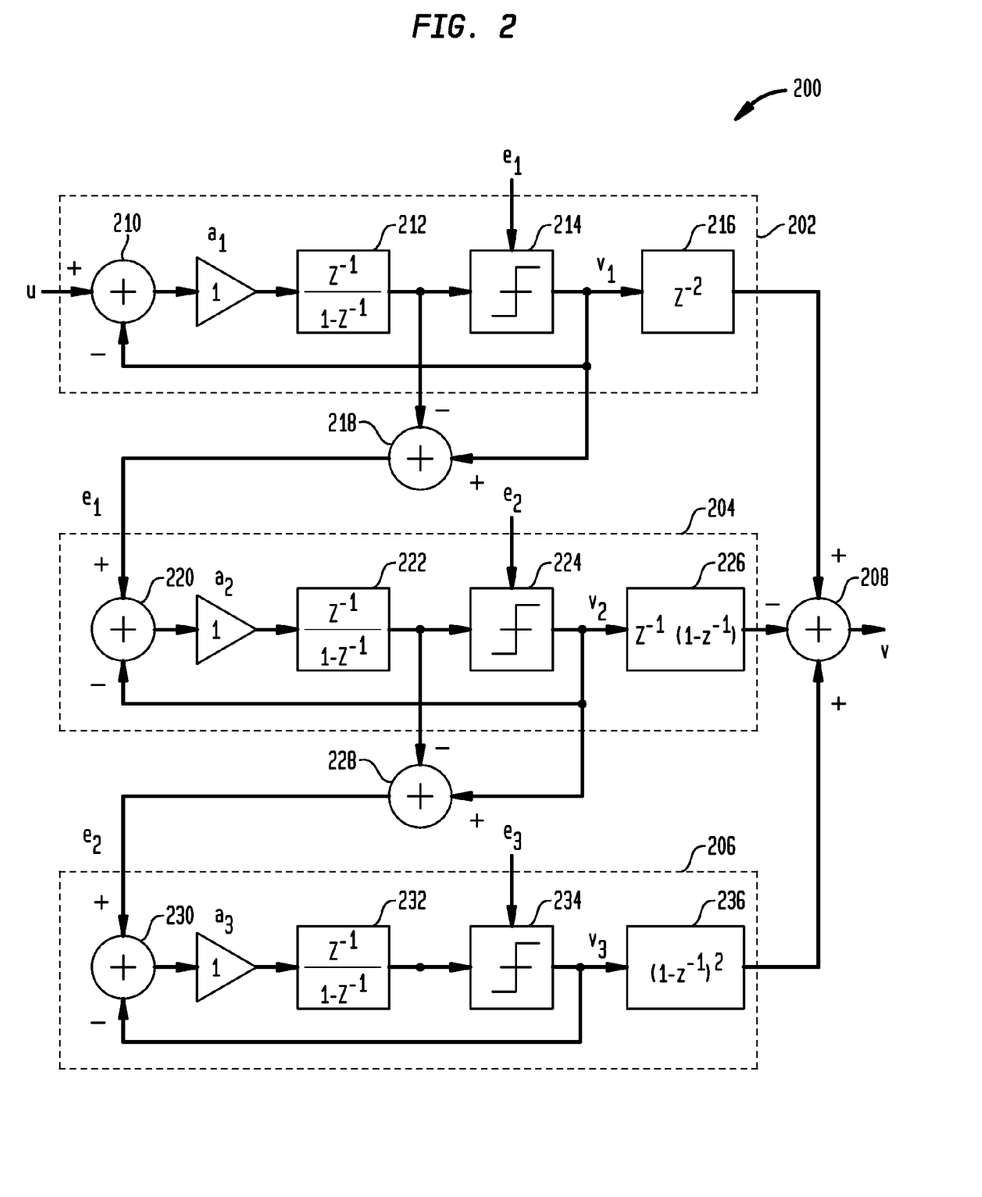
FIG. 2 is a block diagram depicting an exemplary third-order delta-sigma modulator formed using a plurality of cascaded stable one-bit, single-loop delta-sigma modulators.

Specifically, FIG. 2 is a block diagram depicting an exemplary third-order delta-sigma modulator 200 formed using a plurality of cascaded stable one-bit, single-loop delta-sigma modulators. The delta-sigma modulator 200 employs a multi-stage noise shaping (MASH) architecture, and thus can be referred to as a MASH-III digital delta-sigma modulator. Delta-sigma modulator 200 includes three stages, 202, 204 and 206, each stage comprising a low-order noise-shaping filter and a bit-quantizer (e.g., a comparator or slicer), whose respective outputs are combined, using, for example, a first adder 208, so that the low-order filters operate in cascade to provide a higher-order noise-shaping filter.

More particularly, a first stage 202 includes a second adder 210, an amplifier $a_1$ coupled with the second adder, a first filter 212 coupled with an output of amplifier $a_1$, a first bit-quantizer 214 coupled with an output of the first filter, and a first delay element 216 coupled with an output of the first bit-quantizer Adder 210 includes a first input adapted to receive an input signal, u, supplied to the bitstream generator 200, and a second input for receiving a bitstream candidate, $v_1$, generated by bit-quantizer 214. The adder 210 is operative to generate an output signal which is equal to the input signal u minus the bitstream candidate $v_1$. The signal generated by adder 210 is fed to an input of amplifier $a_1$, which in this example has a gain of one (i.e., unity gain). A signal generated by amplifier $a_1$ is fed to an input of the filter 212 which, in this example, has a transfer function $$H(z) = \frac{z^{-1}}{1-z^{-1}}.$$

The bit-quantizer 214 is operative to receive the signal generated by the filter 212 and a first error signal, $e_1$, and to generate the bitstream candidate $v_1$ which is supplied to delay element 216. The delay element 216 has a delay of $z^{-2}$ associated therewith, using z-domain representation. The first error signal $e_1$ is generated by a third adder 218 which is operative to subtract the signal generated by filter 212 from the bitstream candidate $v_1$. The first error signal $e_1$ is supplied as an input to the second stage 204.

The second stage 204 includes a fourth adder 220, an amplifier $a_2$ coupled with the fourth adder, a second filter 222 coupled with an output of amplifier $a_2$, a second bit-quantizer 224 coupled with an output of the second filter, and a third digital filter 226 coupled with an output of the second bit-quantizer. Adder 220 includes a first input adapted to receive the first error signal $e_1$, and a second input for receiving a bitstream candidate, $v_2$, generated by bit-quantizer 224. The adder 220 is operative to generate an output signal which is equal to the input signal $e_1$ minus the bitstream candidate $v_2$. The signal generated by adder 220 is fed to an input of amplifier $a_2$, which in this example has a gain of one. A signal generated by amplifier $a_2$ is fed to an input of the filter 222 which, in this example, has a transfer function $$H(z) = \frac{z^{-1}}{1-z^{-1}}.$$

The bit-quantizer 224 is operative to receive the signal generated by the filter 222 and a second error signal, $e_2$, and to generate the bitstream candidate $v_2$ which is supplied to filter 226. The filter 226 has a transfer function of $z^{-1} \cdot (1-z^{-1})$ associated therewith, using z-domain representation. The second error signal $e_2$ is generated by a fifth adder 228 which is operative to subtract the signal generated by filter 222 from the bitstream candidate $v_2$. The second error signal $e_2$ is supplied as an input to the third stage 206.

Likewise, the third stage 206 includes a sixth adder 230, an amplifier $a_3$ coupled with the sixth adder, a fourth filter 232 coupled with an output of amplifier $a_3$, a third bit-quantizer 234 coupled with an output of the fourth filter, and a fifth digital filter 236 coupled with an output of the third bit-quantizer. Adder 230 includes a first input adapted to receive the second error signal $e_2$, and a second input for receiving a bitstream candidate, $v_3$, generated by bit-quantizer 234. The adder 230 is operative to generate an output signal which is equal to the input error signal $e_2$ minus the bitstream candidate $v_3$. The signal generated by adder 230 is fed to an input of amplifier $a_3$, which in this example has a gain of one. A signal generated by amplifier $a_3$ is fed to an input of the filter 232 which, in this example, has a transfer function $$H(z) = \frac{z^{-1}}{1-z^{-1}}.$$

The bit-quantizer 234 is operative to receive the signal generated by the filter 232 and a third error signal, $e_3$, and to generate the bitstream candidate $v_3$ which is supplied to filter 236. The filter 236 has a transfer function of $(1-z^{-1})^2$ associated therewith, using z-domain representation. The truncation error (i.e., quantization error) of the bit-quantizer 234, represented by signal $e_3$, can be obtained by subtracting the output of 234 from the input of 234.

As previously described, the respective output signals generated by each of the modulator stages 202, 204 and 206 are combined by adder 208. Specifically, adder 208 includes a first input adapted to receive a first signal generated by delay element 216 in the first stage 202, a second input adapted to receive a second signal generated by filter 226 in the second stage 204, and a third input adapted to receive a third signal generated by filter 236 in the third stage 206. The adder 208 is operative to generate an output signal, v, of the bitstream generator 200 which is equal to a sum of the first and third signals from the first stage 202 and third stage 206, respectively, minus the second signal from the second stage 204.

With reference to FIG. 2, the bitstream candidates $v_1$, $v_2$ and $v_3$, represented in the z-domain as $V_1$, $V_2$ and $V_3$, respectively, can be determined using the following derivation:

$$V_1 = (U - V_1) \cdot a_1 \cdot \frac{z^{-1}}{1-z^{-1}} + E_1 \qquad (3)$$

$$V_1(1-z^{-1}) = a_1 z^{-1} \cdot U - z^{-1} \cdot V_1 + (1-z^{-1}) E_1$$

$$V_1(1-z^{-1} + a_1 z^{-1}) = a_1 z^{-1} \cdot U + (1-z^{-1}) E_1$$

$$V_1 = \frac{a_1 z^{-1}}{1+(a_1-1)z^{-1}} \cdot U + \frac{1-z^{-1}}{1+(a_1-1)z^{-1}} \cdot E_1$$

where $a_1$ represents the gain of amplifier $a_1$ in the first stage 202, $E_1$ represents the error signal $e_1$ in the z-domain, and U represents the input signal u in the z-domain. Assuming $a_1$ is equal to one (i.e., unity gain amplifier), equation (3) above reduces to the following expression for determining the bitstream candidate $v_1$:

$$V_1 = z^{-1} \cdot U + (1-z^{-1}) E_1 \qquad (4)$$

In a similar manner, bitstream candidates $v_2$ and $v_3$ can be determined using the following expressions in the z-domain, assuming gains $a_2$ and $a_3$ of amplifiers $a_2$ and $a_3$, respectively, are also equal to one:

$$V_2 = z^{-1} \cdot E_1 + (1-z^{-1})E_2 \quad (5)$$

$$V_3 = z^{-1} \cdot E_2 + (1-z^{-1})E_3 \quad (6)$$

Using equations (4) through (6) above, and incorporating the respective contributions of the delay element 216 and the digital filters 226 and 236, the modulator output signal, v, can be determined using the following derivation, in z-domain representation:

$$V = z^{-2} \cdot V_1 + z^{-1} \cdot (1-z^{-1})(-1) \cdot V_2 + (1-z^{-1})^2 \cdot V_3$$

$$V = z^{-3} \cdot U(1-z^{-1})^3 \cdot E_3 \quad (7)$$

It is evident from equation (7) that the output signal v is indicative of a third-order, one-bit delta-sigma modulator. Note, that the cascaded output shows only contributions from the truncation error $e_3$ of the third stage, while the truncation error $e_2$ of the second stage and the truncation error $e_1$ of the first stage are cancelled. Therefore, the cascaded delta-sigma modulator effectively eliminates the truncation error of the first one or more stages and improves noise shaping of the truncation error of the last stage.

Figure 3A:
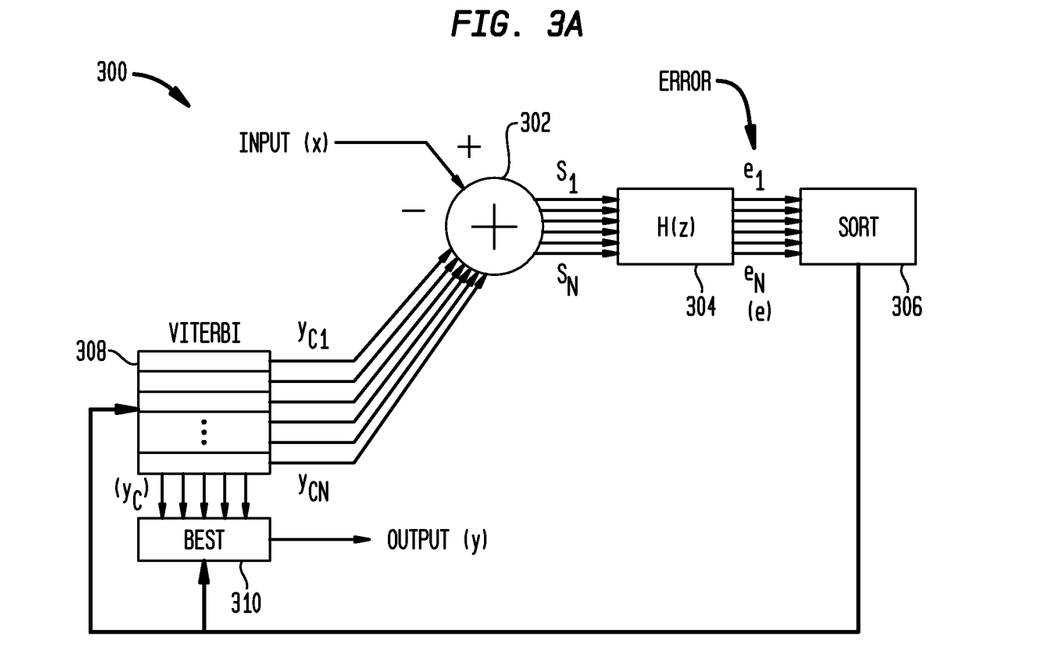
FIG. 3A is a block diagram depicting an illustrative one-bit, single-loop Viterbi bitstream generator.

Delta-sigma modulators (or, more generally, bitstream generators) can be implemented using Viterbi decoders as truncators. With reference now to FIG. 3A, a block diagram depicts an illustrative one-bit, single-loop Viterbi bitstream generator 300. In bitstream generator 300, the truncator is implemented as a Viterbi decoder which provides bitstream candidates $y_{C1}$ through $y_{CN}$. These bitstream candidates $y_{C1}$ through $y_{CN}$ are subtracted from an input x supplied to the modulator to generate corresponding sum signals $s_1$ through $s_N$; signals $s_1$ through $s_N$ are then filtered by a loop filter which generates corresponding filtered error signals $e_1$ through $e_N$. Each bitstream candidate $y_1$ produces a corresponding filtered error signal $e_1$, $i = 1 \ldots N$. These filtered error signals $e_1$ through $e_N$ are sorted by a sorter and the best bitstream candidate of the plurality of candidates, $y_C$, is selected as an output y of the bitstream generator.

More particularly, the bitstream generator 300 comprises an adder 302, a loop filter 304, a sorter 306, and a Viterbi decoder 308, connected in a closed-loop feedback configuration. The adder 302 is operative to combine bitstream candidates, $y_1$ through $y_N$, generated by the Viterbi decoder 308 with an input signal, x, supplied to the modulator 300, and to generate respective output signals, $s_1$ through $s_N$, with each output signal being indicative of a subtraction of a corresponding bitstream candidate from the input signal x, where N is an integer greater than one (e.g., $s_1 = x - y_{C1}$; $s_N = x - y_{CN}$).

Each of the output signals $s_1$ through $s_N$ is passed through the filter 304, having a transfer function H(z), to generate a plurality of corresponding error signals, $e_1$ through $e_N$, referred to collectively herein as error e. Thus, each of the error signals $e_1$ through $e_N$ represents a difference between the input signal x and a corresponding one of the bitstream candidates $y_{C1}$ through $y_{CN}$, respectively. These error signals are then sorted in order of magnitude of error by the sorter 306. The Viterbi decoder 308 uses this error signal to control how the bitstream candidates are generated. A "best" bitstream candidate 310, indicative of a bitstream candidate having a smallest error among a prescribed number of previously stored candidates, is selected as the output signal y of the modulator 300.

An output signal Y of the modulator 300, in z-domain representation, can be determined using the following derivation:

$$(X - Y_C) \cdot H = E; Y = Y_C, \text{ where } E \text{ is minimum} \quad (8)$$

$$Y = X - E \cdot \frac{1}{H}$$

$$Y = X \cdot STF - E \cdot NTF$$

In equation (8) above, an STF of the modulator 300 is assumed to be equal to one (i.e., STF=1), and an NTF is assumed to be equal to 1/H. The error signal E is assumed to be white and uncorrelated with input signal X.

Figure 3B:
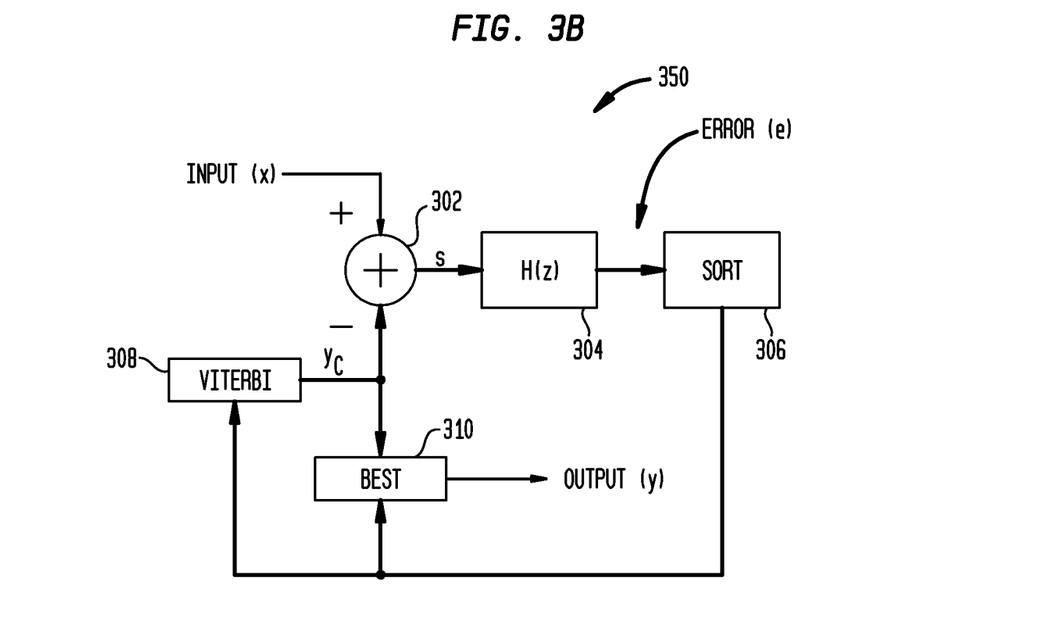
FIG. 3B is a block diagram depicting an exemplary alternative representation of the illustrative one-bit, single-loop Viterbi bitstream generator shown in FIG. 3A.

FIG. 3B is a block diagram depicting an exemplary one-bit, single-loop Viterbi bitstream generator 350. The bitstream generator 350 is merely an alternative representation of the illustrative bitstream generator 300 shown in FIG. 3A. The N-wire wide signals shown in FIG. 3A are merely combined into N-wire wide signal busses in FIG. 3B.

A Viterbi decoder can be implemented using various known algorithms. One possibility is to use a full-trellis implementation of the Viterbi algorithm (see, e.g., Andrew Viterbi, "Error Bounds for Convolutional Codes and an Asymptotically Optimum Decoding Algorithm," *IEEE Transactions on Information Theory*, Vol. 13, No. 2, pp. 260-269, April 1967, the disclosure of which is incorporated by reference herein in its entirety). An alternative possibility is to use a sub-optimal algorithm such as an M-algorithm (see, e.g., R.-K. Gopalan and O. M. Collins, "An Optimization Approach to Single-Bit Quantization," *IEEE Transactions on Circuits and Systems—Part I*, Vol. 56, Issue 2, pp. 2655-2668, December 2009, the disclosure of which is incorporated by reference herein in its entirety). The M-algorithm trades signal-to-noise (SNR) performance of the encoded signal with complexity of the digital hardware implementation. With an increased number of M states used in the M-algorithm, both the SNR performance and the digital hardware complexity of the Viterbi bitstream generator improve.

The stability of a delta-sigma modulator or a Viterbi bitstream generator depends on one or more factors, such as, for example:

An order of a transfer function, H(z), of the digital loop filter in the delta-sigma modulator or Viterbi bitstream generator. A higher order H(z) exhibits more fragile stability than a lower order H(z).

A frequency response of H(z), which can be characterized by the out-of-band gain of H(z) and by the sharpness of the frequency response of H(z). The sharper the frequency response of H(z), the noise shaping is said to be more aggressive and the delta-sigma modulator or Viterbi bitstream generator is more prone to instability (i.e., it has a fragile stability). Also, the sharper the frequency response of H(z), the longer it takes the impulse response h(t) to effectively settle in the time domain; therefore, a larger value is needed for M when the Viterbi bitstream generator is implemented via the M-algorithm In general, a higher order H(z) also exhibits better SNR performance than a lower order H(z), and, furthermore, a sharper H(z) exhibits better SNR performance than a less sharp H(z).

The stability of the Viterbi bitstream generator also depends on an implementation of the Viterbi decoder. Since the digital hardware complexity of a full-trellis Viterbi decoder is usually impractical when used as a bitstream generator, the M-algorithm implementation provides a good compromise between SNR performance and hardware complexity. Hence, there is a tradeoff between SNR performance, hardware complexity and stability when designing bitstream generators.

As previously stated, one disadvantage of a high-order one-bit, single-loop bitstream generator such as 300 (or 350) is that it suffers from instabilities. To address this shortcoming, embodiments of the invention provide a cascaded Viterbi bitstream generator architecture. The cascaded Viterbi bitstream generator architecture according to embodiments of the invention employs a plurality of stable lower-order bitstream generators to fabricate a stable higher-order bitstream generator. As will be described in further detail below, the cascaded Viterbi bitstream generator in accordance with embodiments of the invention preserves the robust stability of the first stage and keeps the high SNR performance of the second stage via the beneficial cascading architecture.

Figure 4:
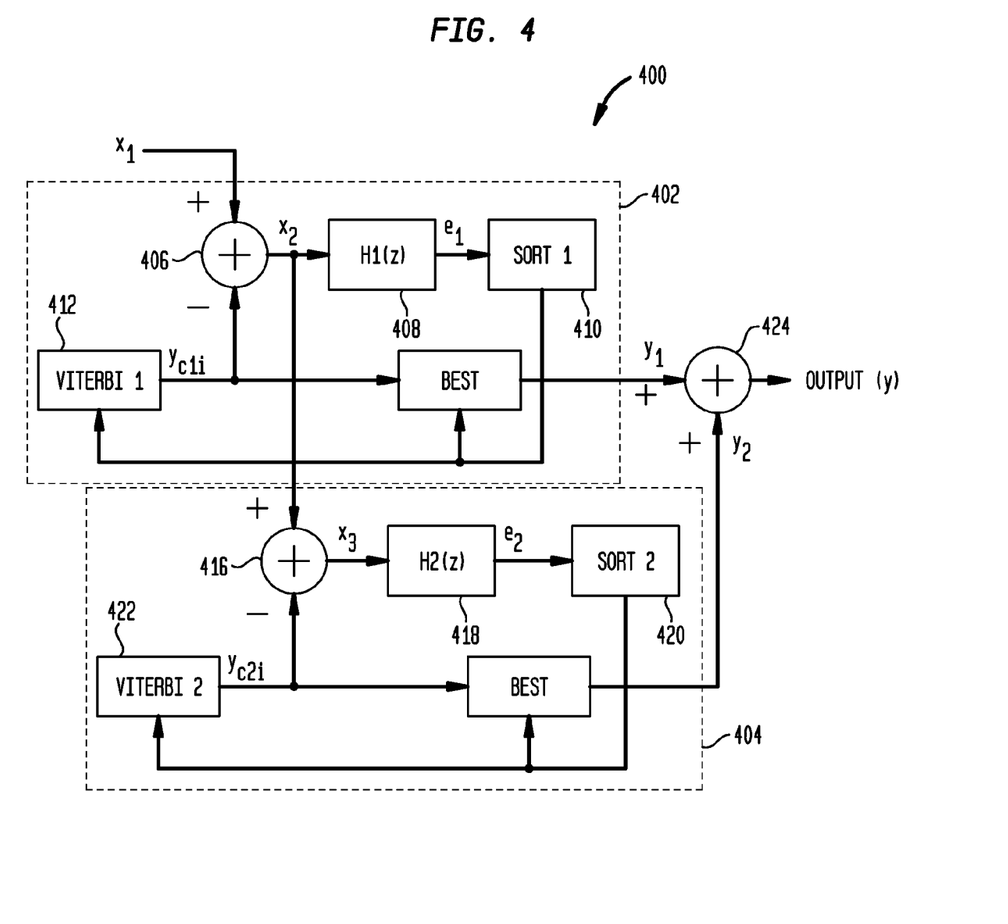
FIG. 4 is a block diagram depicting at least a portion of an exemplary cascaded Viterbi bitstream generator, according to an embodiment of the invention.

FIG. 4 is a block diagram depicting at least a portion of an exemplary cascaded Viterbi bitstream generator 400, according to an embodiment of the invention. The bitstream generator 400 comprises two single-loop bitstream generators, 402 and 404, connected in a cascade configuration. While two single-loop bitstream generators are shown in FIG. 4, it is to be appreciated that embodiments of the invention are not limited to any specific number of cascaded single-loop bitstream generator stages employed. Rather, techniques according to embodiments of the invention can be extended in a similar manner to cascade more than two low-order and stable Viterbi bitstream generators, as will become apparent to those skilled in the art given the teachings herein.

More particularly, a first single-loop bitstream generator stage 402 includes an adder 406, a loop filter 408, a sorter (SORT 1) 410, and a Viterbi decoder (VITERBI 1) 412, connected in a closed-loop feedback configuration. It is to be understood that one or more functional blocks in the first bitstream generator stage 402 may be combined into a single functional block and/or integrated with one or more other blocks. Furthermore, it is to be appreciated that one or more functional blocks in the first bitstream generator stage 402 may be implemented in hardware, in software, or in a combination of hardware and software (e.g., firmware), according to embodiments of the invention.

The adder 406 is operative to combine a bitstream candidate signal, $y_{C1i}$, generated by the Viterbi decoder 412 with an input signal, $x_1$, supplied to the bitstream generator 400, and to generate a combined output signal, $x_2$, indicative of a subtraction of the bitstream candidate signal $y_{C1i}$ from the input signal $x_1$ (i.e., $x_2=x_1-y_{C1i}$). The bitstream candidate signal $y_{C1i}$ represents a quantized estimate of the input signal $x_1$. Signal $x_2$, which represents an error between the input signal $x_1$ and the quantized estimate of the input signal, is then passed through loop filter 408 having a transfer function H1(z). The loop filter 408 is operative to receive the signal $x_2$ and to generate a filtered error signal, $e_1$. The filtered error signal $e_1$ is fed to the sorter 410 which arranges the bitstream candidates as a function of a magnitude of error and selects a bitstream candidate, $y_1$, having a minimum error value among the candidates. Thus, the sorter 410, in conjunction with the Viterbi decoder 412, is operative to select a bitstream candidate, among a plurality of candidates $y_{C1i}$ (i=1 through N, where N is an integer), which has a smallest error value ("BEST" candidate) and therefore represents a closer approximation to the input signal $x_1$ compared to other bitstream candidates processed by the first single-loop bitstream generator stage 402.

Similarly, a second single-loop bitstream generator stage 404 includes an adder 416, a loop filter 418, a sorter (SORT 2) 420, and a Viterbi decoder (VITERBI 2) 422, connected in a closed-loop feedback configuration. The adder 416 is operative to combine a bitstream candidate signal, $y_{C2i}$, generated by the Viterbi decoder 422 with an input signal, which in this case is the error signal $x_2$ generated by the adder 406 in the first bitstream generator stage 402, and to generate a combined output signal, $x_3$, indicative of a subtraction of the bitstream candidate signal $y_{C2i}$ from the input signal $x_2$ (i.e., $x_3=x_2-y_{C2i}$). The bitstream candidate signal $y_{C2i}$ represents a more accurate quantization of the error compared to the bitstream candidate signal $y_{C1i}$.

Signal $x_3$, which represents a difference between signal $x_2$ and the bitstream candidate signal $y_{C2i}$, is then passed through loop filter 418 having a transfer function H2(z). The loop filter 418 is operative to receive the signal $x_3$ and to generate a filtered error signal, $e_2$. The filtered error signal $e_2$ is fed to the sorter 420 which arranges bitstream candidates as a function of a magnitude of error and selects a bitstream candidate, $y_2$, having a minimum error value among the candidates. The sorter 420, in conjunction with the Viterbi decoder 422, is operative to select a bitstream candidate, among a plurality of candidates $y_{C2i}$ (i=1 through N), having a smallest error value ("BEST" candidate) and therefore represents a closer approximation to the signal $x_2$ compared to other bitstream candidates processed by the second single-loop bitstream generator stage 404.

It is to be appreciated that, although shown as separate functional modules for clarity purposes, it is contemplated that one or more modules in the cascaded Viterbi bitstream generator 400 can be combined together and/or integrated with one or more other modules, with the resulting module(s) incorporating the respective functions of the combined modules. For example, the Viterbi decoder 412 can be combined with the sorter 410, according to embodiments of the invention, to implement a Viterbi decoder that incorporates a sorting function therein.

A global output signal, y, generated by the cascaded Viterbi bitstream generator 400 is produced by combining the respective outputs from the individual single-loop bitstream generator stages 402 and 404. To accomplish this, the cascaded bitstream generator 400 includes an adder 424, or alternative combination circuitry, operative to add the bitstream signal $y_2$ generated by the second bitstream generator stage 404 from the bitstream signal $y_1$ generated by the first bitstream generator stage 402 (i.e., $y=y_1+y_2$). The output signal y beneficially provides a more accurate approximation to the input signal $x_1$ than the individual bitstream signal $y_1$ output by the first bitstream generator stage 402.

The output signal y of the cascaded Viterbi bitstream generator 400, in z-domain representation, is calculated using the following derivation, where capital letters are used to denote corresponding signals in the z-domain:

$$(X_1-Y_{C1i}) \cdot H1 = E_1,$$

where $Y_1=Y_{C1i}|E_1$=minimum, which leads to $$Y_1 = X_1 - \frac{1}{H1} \cdot E_1$$

$$Y_2 = X_2 - \frac{1}{H2} \cdot E_2$$

$$X_2 = \frac{1}{H1} \cdot E_1$$

The output Y is given by $Y=Y_1+Y_2$, and therefore $$Y = Y_1 + Y_2 = \left(X_1 - \frac{1}{H1} \cdot E_1\right) + \left(X_2 - \frac{1}{H2} \cdot E_2\right) \quad (9)$$

$$Y = X_1 - \frac{1}{H2} \cdot E_2$$

In equation (9) above, the output Y of the cascaded Viterbi bitstream generator 400 includes only the noise-shaped truncation error terms from the second stage $$\frac{1}{H2} \cdot E_2,$$

and the noise-shaped truncation error terms from the first stage, namely, $$\frac{1}{H1} \cdot E_1,$$

are beneficially cancelled (or at least reduced).

The above derivations provide guidance on how to design the digital filter transfer functions H1 and H2, as described in further detail below with reference to the exemplary Viterbi bitstream generator 400 shown in FIG. 4. Illustrative examples of these transfer functions can be deduced from MATLAB® (a registered trademark of The Math Works, Inc.) simulation results shown in FIGS. 6 through 10, according to embodiments of the invention.

Specifically, the transfer function H1(z) of filter 408 in the first stage 402 is designed, in accordance with an embodiment of the invention, having good stability for full-scale amplitude input signals, but with modest signal-to-noise ratio (SNR) performance (e.g., about 30 to 50 dB). The second stage 404 quantizes the noise-shaped error term of the first stage 402, namely, $$\frac{1}{H1} \cdot E_1,$$

which was relatively small power (e.g., about −40 to −30 decibels relative to digital full scale (dBFS)) in the frequency band of interest. Therefore, the transfer function H2(z) of filter 418 in the second stage 404 should be designed having good stability for small input signals (e.g., about −40 to −30 dBFS), but should exhibit very good SNR performance (e.g., about 60 to 80 dB). Such a Viterbi bitstream generator with very good SNR performance (e.g., about 60 to 80 dB) for small input signals (e.g., about −40 to −30 dBFS) would have poor stability for large input signals (e.g., about −10 to 0 dBFS). Thus, the first stage 402 trades SNR performance for large input signal stability, while the second stage 404 trades large input signal stability for SNR performance. The resulting cascaded output Y exhibits the full-scale (i.e., about 0 dBFS) stability of the first stage 402 and the very good SNR performance of the second stage 404, therefore keeping the best characteristics of each stage, cancels the undesired high truncation error terms of the first stage $$\left(\frac{1}{H1} \cdot E_1\right),$$

and outputs the low truncation error terms of the second stage $$\left(\frac{1}{H2} \cdot E_2\right),$$

as shown above in equation (9).

Figure 5:
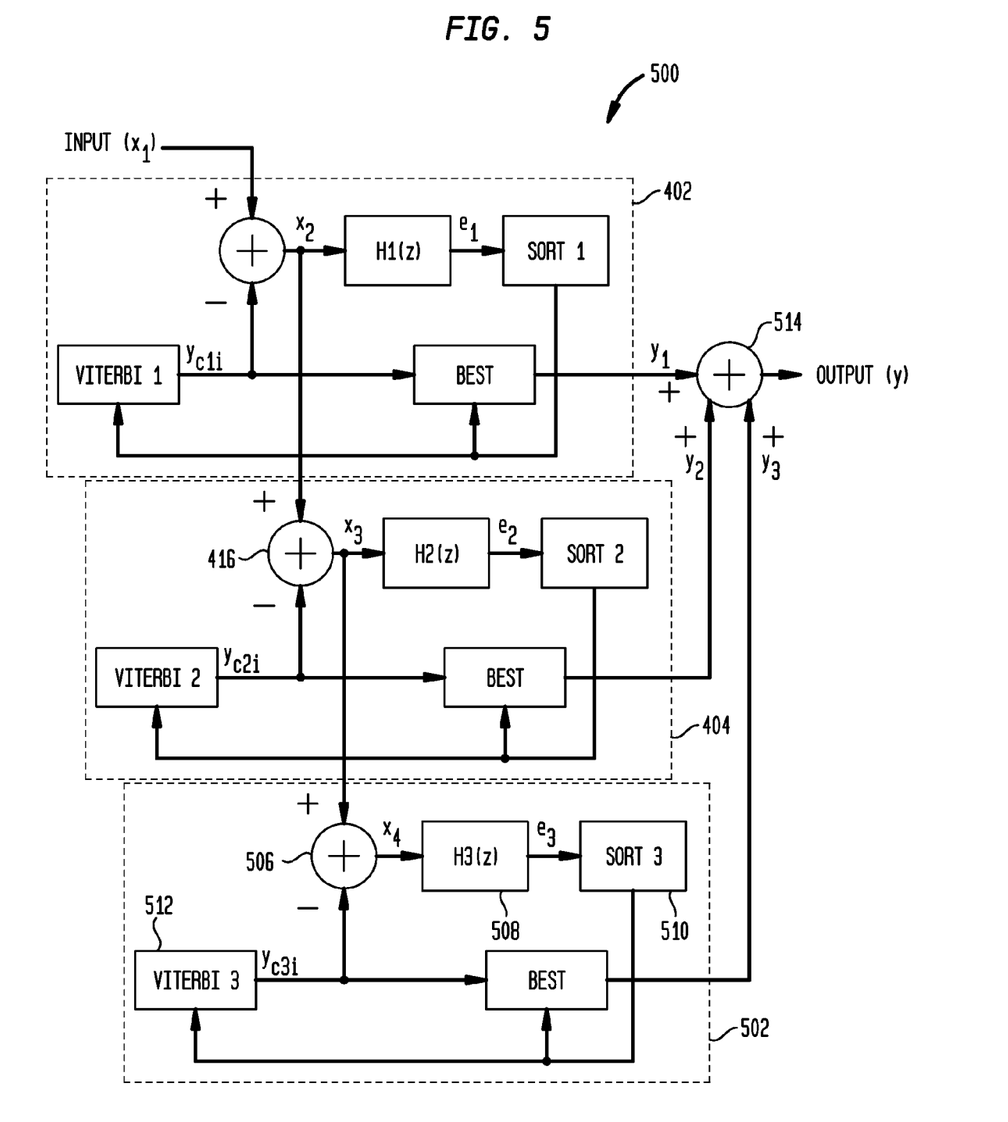
FIG. 5 is a block diagram depicting at least a portion of an exemplary cascaded Viterbi bitstream generator, according to another embodiment of the invention.

FIG. 5 is a block diagram depicting at least a portion of an exemplary cascaded Viterbi bitstream generator 500, according to another embodiment of the invention. Bitstream generator 500 essentially extends principles utilized in the illustrative bitstream generator 400 shown in FIG. 4 by cascading a third single-loop bitstream generator stage 502 to the first and second single-loop bitstream generator stages 402 and 404, respectively, described above in conjunction with FIG. 4.

With continued reference again to FIG. 5, like each of the first and second single-loop bitstream generator stages 402 and 404, respectively, previously described in conjunction with FIG. 4, a third single-loop bitstream generator stage 502 includes an adder 506, a loop filter 508, a sorter (SORT 3) 510, and a Viterbi decoder (VITERBI 3) 512, connected in a closed-loop feedback configuration. The adder 506 is operative to combine a bitstream candidate signal, $y_{C3i}$, generated by the Viterbi decoder 512 with an input signal, which in this case is the error signal $x_3$ generated by the adder 416 in the second bitstream generator stage 404, and to generate a combined output signal, $x_4$, indicative of a subtraction of the bitstream candidate signal $y_{C3i}$ from the input signal $x_3$ (i.e., $x_4 = x_3 - y_{C3i}$).

Signal $x_4$, which represents a difference between signal $x_3$ and the bitstream candidate signal $y_{C3i}$, is then passed through loop filter 508 having a transfer function H3(z). The loop filter 508 is operative to receive the signal $x_4$ and to generate a filtered error signal, $e_3$. The filtered error signal $e_3$ is fed to the sorter 510 which is operative to arrange bitstream candidates as a function of a magnitude of error, and to select a bitstream candidate, $y_3$, having a minimum error value among the stored candidates. The sorter 510, in conjunction with the Viterbi decoder 512, is operative to select a bitstream candidate, among a plurality of candidates $y_{C3i}$ (i=1 through N, where N is an integer), having a smallest error value ("BEST" candidate) and therefore represents a closer approximation to the input signal $x_4$ compared to other bitstream candidates processed by the third single-loop bitstream generator stage 502.

An output signal, y, generated by the cascaded Viterbi bitstream generator 500 is produced by combining the respective outputs from the individual single-loop bitstream generator stages 402, 404 and 502. To accomplish this, the bitstream generator 500 includes an adder 514, or alternative combination circuitry, operative to add the bitstream signals $y_2$ and $y_3$ generated by the second and third bitstream generator stages 404 and 502, respectively, to the bitstream signal $y_1$ generated by the first bitstream generator stage 402 (i.e., $y = y_1 + y_2 + y_3$). The output signal y generated by the bitstream generator 500, which includes three cascaded single-loop bitstream generator stages, beneficially provides a more accurate approximation to the input signal $x_1$ than the individual bitstream signal output $y_1$ generated by the first bitstream generator stage 402.

Moreover, the output signal y generated by the bitstream generator 500 shown in FIG. 5, which includes three cascaded single-loop bitstream generator stages, generally provides a beneficially more accurate approximation to the input signal $x_1$ compared to the Viterbi bitstream generator 400 shown in FIG. 4, which includes two cascaded single-loop bitstream generator stages. Hence, the number of cascaded single-loop bitstream generator stages in the Viterbi bitstream generator can be advantageously controlled to produce a required level of accuracy of the output signal, according to embodiments of the invention.

The output signal y of the cascaded Viterbi bitstream generator 500, in z-domain representation, is calculated using the following derivation, where, as in the expressions above, capital letters are used to denote corresponding signals in the z-domain:

$$Y_1 = X_1 - \frac{1}{H1} \cdot E_1$$

$$Y_2 = X_2 - \frac{1}{H2} \cdot E_2$$

$$Y_3 = X_3 - \frac{1}{H3} \cdot E_3$$

$$X_2 = \frac{1}{H1} \cdot E_1$$

$$X_3 = \frac{1}{H2} \cdot E_2$$

The output Y is given by $Y=Y_1+Y_2+Y_3$, and therefore $$Y = \left(X_1 - \frac{1}{H1} \cdot E_1\right) + \left(X_2 - \frac{1}{H2} \cdot E_2\right) + \left(X_3 - \frac{1}{H3} \cdot E_3\right) \quad (10)$$

$$Y = X_1 - \frac{1}{H3} \cdot E_3$$

As apparent from equation (10) above, the output Y of the cascaded Viterbi bitstream generator 500 includes only the noise-shaped truncation error terms from the third stage, $$\frac{1}{H3} \cdot E_3,$$

and the noise-shaped truncation error terms from the first stage, namely, $$\frac{1}{H1} \cdot E_1,$$

and from the second stage, namely, $$\frac{1}{H2} \cdot E_2,$$

are both beneficially cancelled.

Figure 6:
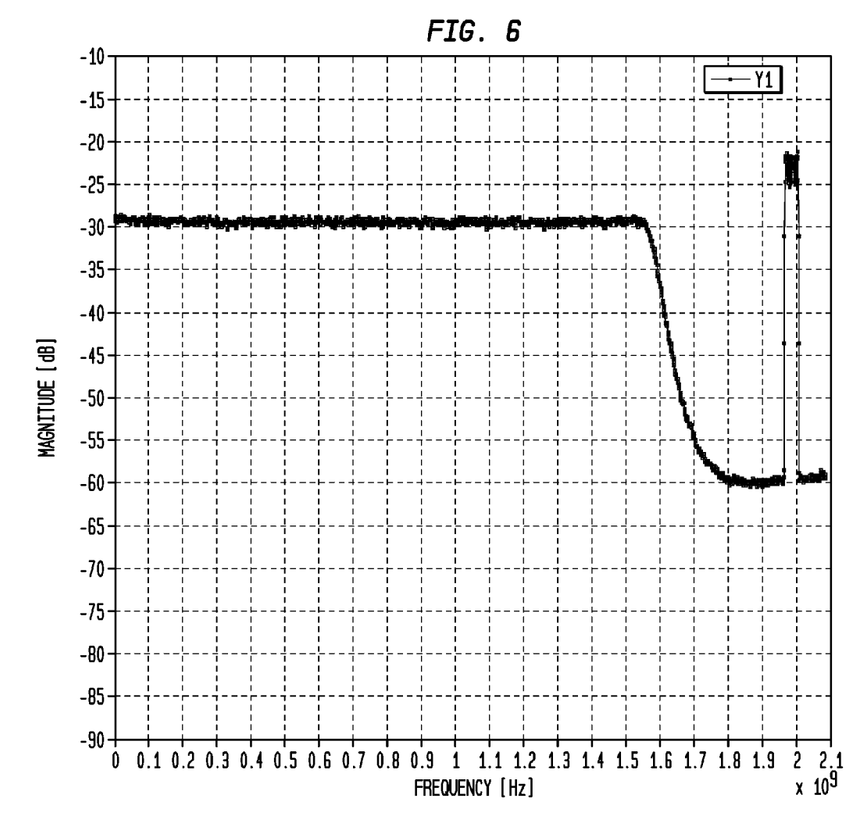
FIGS. 6 through 10 are waveforms depicting exemplary simulation results for the illustrative cascaded Viterbi bitstream generator shown in FIG. 4.
Figure 7:
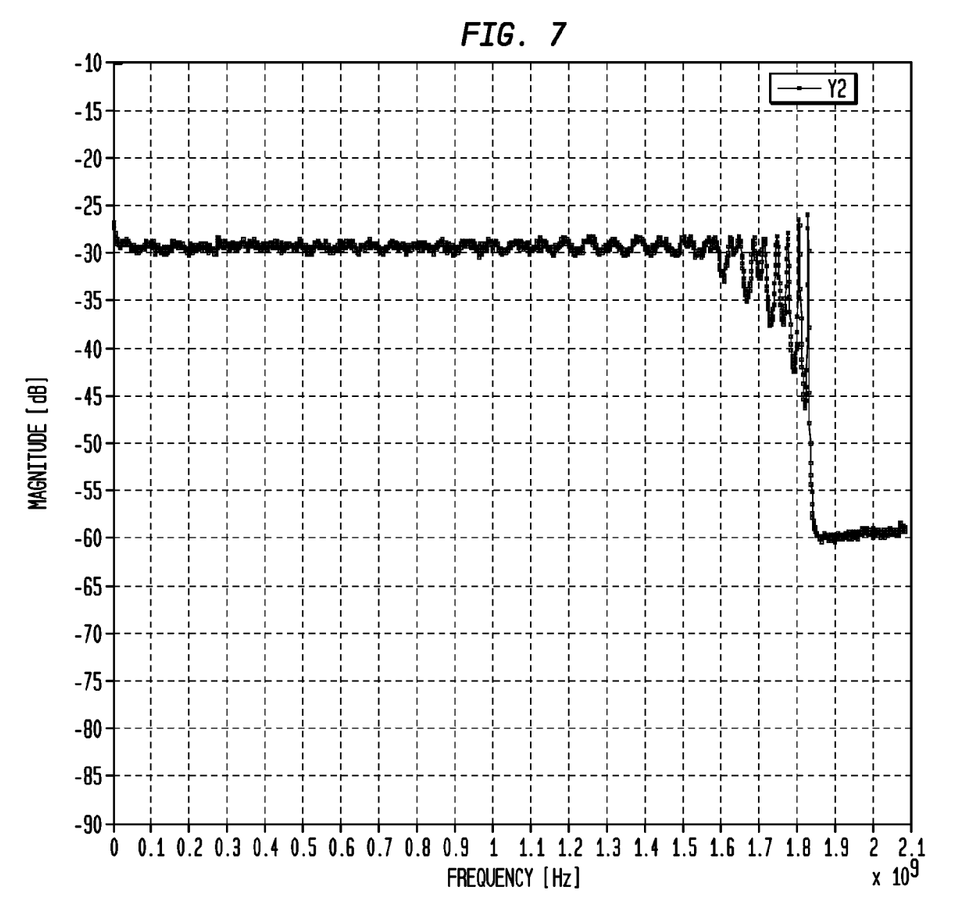
Figure 8:
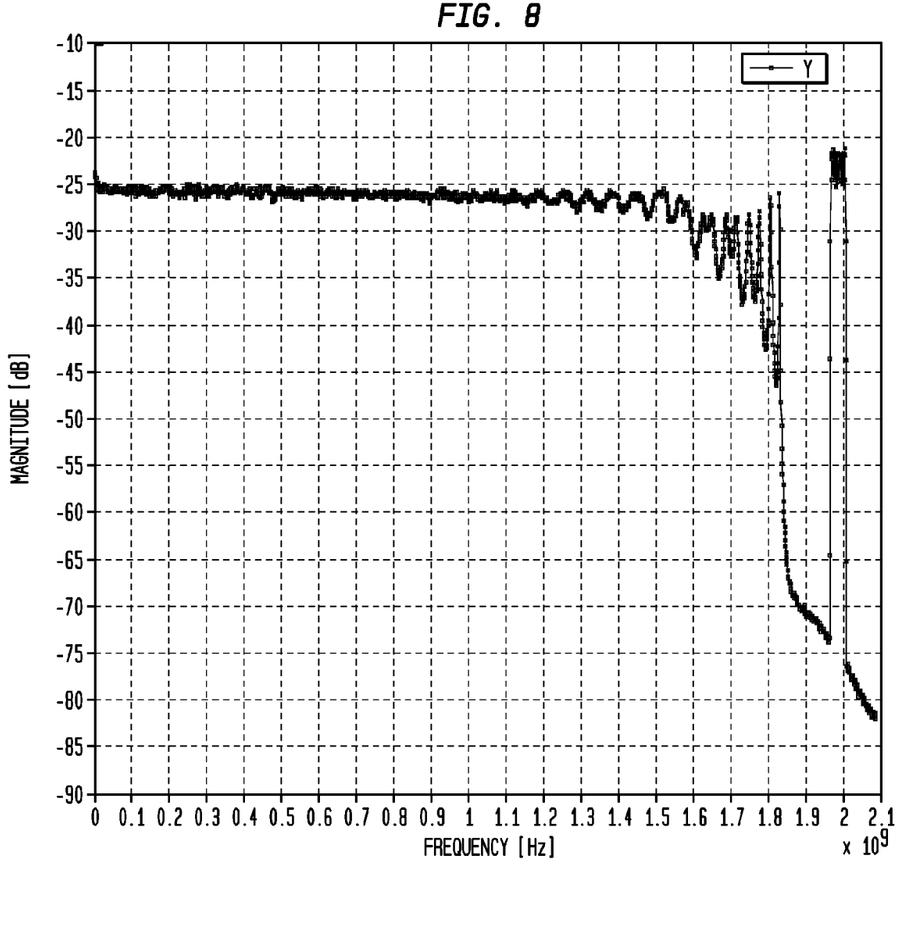
Figure 9:
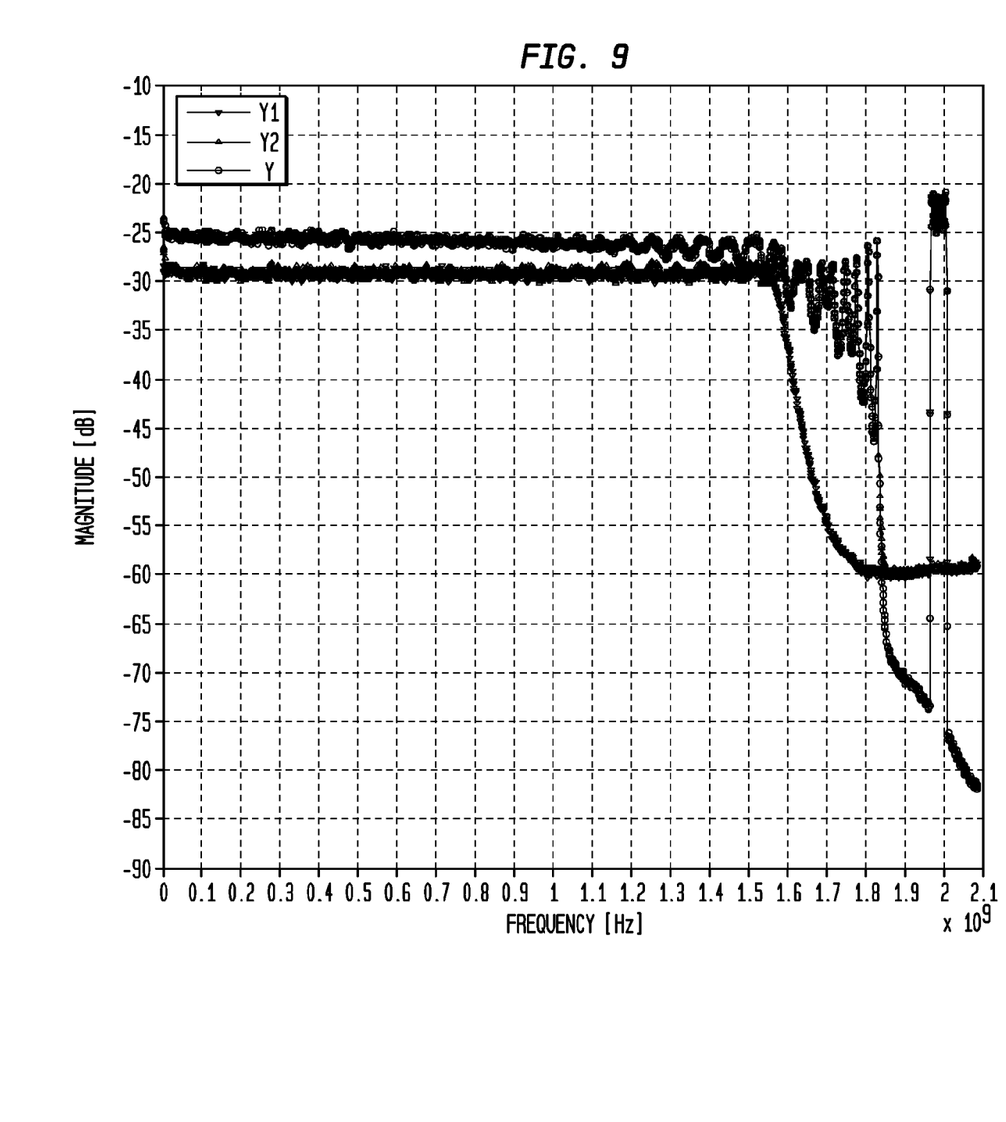
Figure 10:
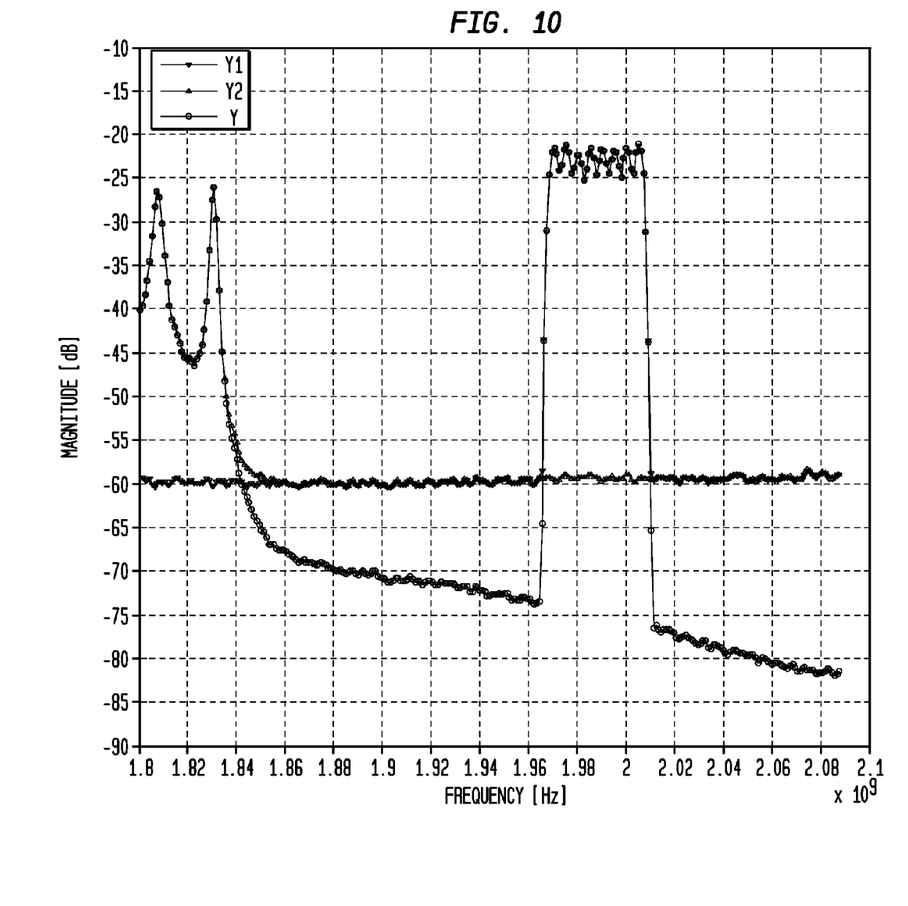

By way of example only and without loss of generality, FIGS. 6 through 10 depict MATLAB® simulation results for the illustrative cascaded Viterbi bitstream generator 400 shown in FIG. 4. The exemplary waveforms shown in FIGS. 6-10 were obtained using a sampling frequency of 4.17792 gigahertz (GHz). The input signal ($x_1$) was chosen to be a 40-megahertz (MHz) wide composite modulated signal with eight carriers, each modulated by 5-MHz wideband code division multiple access (WCDMA) signals. The composite modulated signal has undergone a crest-factor reduction (CFR) to 6.5 dB. Spectra of the signals $y_1$, $y_2$ ($=x_1-y_1$), and y ($=y_1+y_2$) are shown in FIGS. 6, 7 and 8, respectively. The performance improvement in excess of 10 dB due to cascading is shown in FIGS. 9 and 10.

At least a portion of the techniques according to embodiments of the present invention may be implemented in an integrated circuit. In forming integrated circuits, identical die are typically fabricated in a repeated pattern on a surface of a semiconductor wafer. Each die includes a device described herein, and may include other structures and/or circuits. The individual die are cut or diced from the wafer, then packaged as an integrated circuit. One skilled in the art would know how to dice wafers and package die to produce integrated circuits. Any of the exemplary circuits illustrated in the accompanying figures, or portions thereof, may be part of an integrated circuit. Integrated circuits so manufactured are considered part of embodiments of the invention.

An integrated circuit in accordance with embodiments of the invention can be employed in essentially any application and/or electronic system in which digital coding and/or modulation/demodulation is utilized. Suitable systems for implementing embodiments of the invention may include, but are not limited, to power amplifiers (e.g., SWPAs), transmitters, receivers, signal generators, communication networks, electronic instruments (e.g., measurement equipment), etc. Systems incorporating such integrated circuits are considered part of embodiments of the invention. Given the teachings of embodiments of the invention provided herein, one of ordinary skill in the art will be able to contemplate other implementations and applications of the embodiments of the invention.

The illustrations of embodiments of the invention described herein are intended to provide a general understanding of the structure of various embodiments, and they are not intended to serve as a complete description of all the elements and features of apparatus and systems that might make use of the structures described herein. Many other embodiments will become apparent to those skilled in the art given the teachings herein; other embodiments are utilized and derived therefrom, such that structural and logical substitutions and changes can be made without departing from the scope of this disclosure. The drawings are also merely representational and are not drawn to scale. Accordingly, the specification and drawings are to be regarded in an illustrative rather than a restrictive sense.

Embodiments of the invention are referred to herein, individually and/or collectively, by the term "embodiment" merely for convenience and without intending to limit the scope of this application to any single embodiment or inventive concept if more than one is, in fact, shown. Thus, although specific embodiments have been illustrated and described herein, it should be understood that an arrangement achieving the same purpose can be substituted for the specific embodiment(s) shown; that is, this disclosure is intended to cover any and all adaptations or variations of various embodiments. Combinations of the above embodiments, and other embodiments not specifically described herein, will become apparent to those of skill in the art given the teachings herein.

The abstract is provided to comply with 37 C.F.R. §1.72(b), which requires an abstract that will allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in a single embodiment for the purpose of streamlining the disclosure. This method of disclosure is not to be interpreted as reflecting an intention that the claimed embodiments require more features than are expressly recited in each claim. Rather, as the appended claims reflect, inventive subject matter lies in less than all features of a single embodiment. Thus the following claims are hereby incorporated into the Detailed Description, with each claim standing on its own as separately claimed subject matter.

Given the teachings of embodiments of the invention provided herein, one of ordinary skill in the art will be able to contemplate other implementations and applications of the techniques of embodiments of the invention. Although illustrative embodiments of the invention have been described herein with reference to the accompanying drawings, it is to be understood that embodiments of the invention are not limited to those precise embodiments, and that various other changes and modifications are made therein by one skilled in the art without departing from the scope of the appended claims.

What is claimed is:

1. A bitstream generator, comprising:
at least first and second bitstream generator stages connected in a cascaded arrangement, the first bitstream generator stage including a first adder adapted to receive an input signal supplied to the bitstream generator and operative to generate a first error signal indicative of a difference between the input signal and a first bitstream candidate that represents a closest approximation to the input signal among a plurality of bitstream candidates generated by the first bitstream generator stage, the second bitstream generator stage including a second adder adapted to receive the first error signal generated by the first adder and operative to generate a second error signal indicative of a difference between the first error signal and a second bitstream candidate that represents a closest approximation to the first error signal among a plurality of bitstream candidates generated by the second bitstream generator stage; and
a third adder adapted to receive first and second output signals generated by the first and second bitstream generator stages, respectively, and operative to generate a global output signal of the bitstream generator that more closely approximates the input signal compared to the first output signal generated by the first bitstream generator stage, wherein the bitstream generator comprises a combination of software and hardware.

2. The bitstream generator of claim 1, wherein the first bitstream generator stage further comprises a loop filter having an input adapted to receive the first error signal and operative to generate a filtered error signal.

3. The bitstream generator of claim 2, wherein the first bitstream generator stage further comprises a sorter coupled with an output of the loop filter, the sorter being operative to arrange the plurality of bitstream candidates generated by the first bitstream generator stage as a function of a magnitude of error and to select a bitstream candidate having a minimum error value among the plurality of bitstream candidates generated by the first bitstream generator stage.

4. The bitstream generator of claim 1, wherein the first bitstream generator stage further comprises a Viterbi decoder operative to generate the plurality of bitstream candidates generated by the first bitstream generator stage, to store at least a subset of the plurality of bitstream candidates generated by the first bitstream generator stage, and to select, from the plurality of bitstream candidates generated by the first bitstream generator stage, the first bitstream candidate having a magnitude of error which is lower than other bitstream candidates generated by the first bitstream generator stage.

5. The bitstream generator of claim 3, wherein the second bitstream generator stage further comprises a loop filter having an input adapted to receive the second error signal and operative to generate a filtered error signal.

6. The bitstream generator of claim 5, wherein the second bitstream generator stage further comprises a sorter coupled with an output of the loop filter, the sorter being operative to arrange the plurality of bitstream candidates generated by the second bitstream generator stage as a function of a magnitude of error and to select a bitstream candidate having a minimum error value among the plurality of bitstream candidates generated by the second bitstream generator stage.

7. The bitstream generator of claim 5, wherein a transfer function of the loop filter in the second bitstream generator stage is configured so as to substantially cancel noise-shaped truncation error generated by the first bitstream generator stage.

8. The bitstream generator of claim 1, wherein the second bitstream generator stage further comprises a Viterbi decoder operative to generate the plurality of bitstream candidates generated by the second bitstream generator stage, to store at least a subset of the plurality of bitstream candidates generated by the second bitstream generator stage, and to select, from the plurality of bitstream candidates generated by the second bitstream generator stage, the second bitstream candidate having a magnitude of error which is lower than other bitstream candidates generated by the second bitstream generator stage.

9. The bitstream generator of claim 1, further comprising a third bitstream generator stage, the third bitstream generator stage including a fourth adder adapted to receive the second error signal generated by the second adder and operative to generate a third error signal indicative of a difference between the second error signal and a third bitstream candidate that represents a closest approximation to an input signal supplied to the third bitstream generator stage among a plurality of bitstream candidates generated by the third bitstream generator stage.

10. The bitstream generator of claim 9, wherein the third bitstream generator stage further comprises:
a loop filter having an input adapted to receive the third error signal and operative to generate a filtered error signal; and
a sorter coupled with an output of the loop filter, the sorter being operative to arrange the plurality of bitstream candidates generated by the third bitstream generator stage as a function of a magnitude of error and to select a bitstream candidate having a minimum error value among the plurality of bitstream candidates generated by the third bitstream generator stage.

11. The bitstream generator of claim 9, wherein the third bitstream generator stage further comprises a Viterbi decoder operative to generate the plurality of bitstream candidates generated by the third bitstream generator stage, to store at least a subset of the plurality of bitstream candidates generated by the third bitstream generator stage, and to select, from the plurality of bitstream candidates generated by the third bitstream generator stage, the third bitstream candidate having a magnitude of error which is lower than other bitstream candidates generated by the third bitstream generator stage.

12. The bitstream generator of claim 1, wherein each of the first and second bitstream generator stages comprises a single-loop Viterbi bitstream generator.

13. The bitstream generator of claim 1, wherein the second bitstream generator stage is configured such that noise-shaped truncation error generated by the first bitstream generator stage is cancelled.

14. The bitstream generator of claim 1, wherein the second bitstream generator stage is configured such that noise-shaped truncation error generated by the first bitstream generator stage is at least reduced.

15. The bitstream generator of claim 1, wherein at least a portion of the bitstream generator is fabricated in at least one integrated circuit.

16. An electronic system, comprising:
an integrated circuit including at least one bitstream generator, the at least one bitstream generator comprising:
at least first and second bitstream generator stages connected in a cascaded arrangement, the first bitstream generator stage including a first adder adapted to receive an input signal supplied to the bitstream generator and operative to generate a first error signal indicative of a difference between the input signal and a first bitstream candidate that represents a closest approximation to the input signal among a plurality of bitstream candidates generated by the first bitstream generator stage, the second bitstream generator stage including a second adder adapted to receive the first error signal generated by the first adder and operative to generate a second error signal indicative of a difference between the first error signal and a second bitstream candidate that represents a closest approximation to the first error signal among a plurality of bitstream candidates generated by the second bitstream generator stage; and
a third adder adapted to receive first and second output signals generated by the first and second bitstream generator stages, respectively, and operative to generate a global output signal of the bitstream generator that more closely approximates the input signal compared to the first first output signal generated by the first bitstream generator stage.

17. The system of claim 16, wherein the first bitstream generator stage in the at least one bitstream generator further comprises a Vierbi decoder operative to generate the plurality of bitstream candidates generated by the first bitstream generator stage, to store at least a subset of the plurality of bitstream candidataes generated by the first bitstream generator stage, and to select, from the plurality of bitstream candidates generated by the first bitstream generator stage, the first bitstream candidate having a magnitude of error which is lower than other bitstream candidates generated by the first bitstream generator stage.

18. The system of claim 16, wherein the first bitstream generator stage in the at least one bitstream generator further comprises a Viterbi decoder operative to generate the plurality of bitstream candidates generated by the first bitstream generator stage, to store at least a subset of the plurality of bitstream candidates generated by the first bitstream generator stage, and to select, from the plurality of bitstream candidates generated by the first bitstream generator stage, the first bitstream candidate having a magnitude of error which is lower than other bitstream candidates generated by the first bitstream generator stage.

19. The system of claim 16, wherein the at least one bitstream generator comprises a third bitstream generator stage, the third bitstream generator stage including a fourth adder adapted to receive the second error signal generated by the second adder and operative to generate a third error signal indicative of a difference between the second error signal and a third bitstream candidate that represents a closest approximation to an input signal supplied to the third bitstream generator stage among a plurality of bitstream candidates generated by the third bitstream generator stage.

20. A method for forming a stable higher-order bitstream generator using a plurality of lower-order bitstream generators, the method comprising:
providing at least first and second bitstream generator stages;
connecting the first and second bitstream generator stages in a cascaded arrangement, the first bitstream generator stage including a first adder adapted to receive an input signal supplied to the bitstream generator and operative to generate a first error signal indicative of a difference between the input signal and a first bitstream candidate that represents a closest approximation to the input signal among a plurality of bitstream candidates generated by the first bitstream generator stage, the second bitstream generator stage including a second adder adapted to receive the first error signal generated by the first adder and operative to generate a second error signal indicative of a difference between the first error signal and a second bitstream candidate that represents a closest approximation to the first error signal among a plurality of bitstream candidates generated by the second bitstream generator stage; and
adding first and second output signals generated by the first and second bitstream generator stages, respectively, to thereby generate a global output signal of the bitstream generator that more closely approximates the input signal compared to the first output signal generated by the first bitstream generator stage.

* * * * *